United States Patent [19]

Maeda et al.

[11] Patent Number: 5,037,724

[45] Date of Patent: Aug. 6, 1991

[54] PEELING SOLUTION FOR PHOTO- OR ELECTRON BEAM-SENSITIVE RESIN

[75] Inventors: Yoshio Maeda, Fujimi; Shigeki Shimokawa, Yokkaichi, both of Japan

[73] Assignees: Hoya Corporation; Mitsubishi Gas Chemical Company, both of Tokyo, Japan

[21] Appl. No.: 314,961

[22] Filed: Feb. 24, 1989

[30] Foreign Application Priority Data

Feb. 25, 1988 [JP] Japan ............................ 63-43425

[51] Int. Cl.$^5$ .................................. G03C 5/44
[52] U.S. Cl. .................................. 430/331; 430/309; 430/325; 430/329; 134/2; 252/102
[58] Field of Search ............... 430/309, 325, 329, 331; 252/600, 102; 134/2

[56] References Cited

U.S. PATENT DOCUMENTS 2,898,181  8/1959  Dithman et al. .................... 252/102
4,900,352  2/1990  Wada et al. ......................... 544/299

FOREIGN PATENT DOCUMENTS 24627  2/1979  Japan .
6101   2/1982  Japan .

*Primary Examiner*—Hoa Van Le
*Attorney, Agent, or Firm*—Nixon & Vanderhye

[57] ABSTRACT

The peeling solution for photo- or electron beam-sensitive resin according to the present invention consists of an aqueous solution consisting of hydrogen peroxide and a compound represented by the general formula (I)

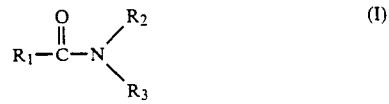

wherein $R_1$ is H or an alkyl group of 1-2 carbon atoms, $R_2$ is H or an alkyl group of 1-3 carbon atoms, and $R_3$ is H or an alkyl group of 1-3 carbon atoms.

6 Claims, No Drawings

PEELING SOLUTION FOR PHOTO- OR ELECTRON BEAM-SENSITIVE RESIN

BACKGROUND OF THE INVENTION

(1) Field of the Invention

The present invention relates to a peeling solution for photo- or electron beam-sensitive resin and to a process for peeling off a photo- or electron beam-sensitive resin using said solution. The present invention is applied for removing a photo- or electron beam-sensitive resin from a substrate.

(2) Description of the Prior Art

As substrates on which a photo- or electron beam-sensitive resin is to be coated, there are, for example, those composed of glass, metal, plastic or ceramic, as well as those consisting of a glass and a thin film (made of a metal or the like) formed thereon. On a case of using, as such a substrate, a photomask blank (hereinafter may be referred to simply as "blank") which is used as a material for photomask in the production of semiconductor integrated circuits (e.g. IC, LSI), there are explained below the conventional peeling solutions for photo- or electron beam-sensitive resin and the conventional processes for peeling off a photo- or electron beam-sensitive resin.

The above mentioned blank consists of a light-transmitting substrate (e.g. polished silica glass) and a light-shielding film (e.g. chromium film) formed on one main surface of the substrate. In producing a photomask from the blank, firstly a photo- or electron beam-sensitive resin such as photoresist, electron beam resist or the like is coated on the light-shielding film of the blank by a coating method such as spin coating or the like.

In the above coating of a photo- or electron beam-sensitive resin on the light-shielding film, it occurs at times that the film of the photo- or electron beam-sensitive resin formed on the light-shielding film of the blank has non-uniform thickness depending upon the resin coating conditions (e.g. temperature) and the resin properties (e.g. viscosity). When such a blank on which a photo- or electron beam-sensitive resin film has been formed in non-uniform thickness is then subjected to a photolithography step or an electron beam lithography step to produce a photomask, the light-shielding pattern formed on the light-transmitting substrate has no constant line width as required and it is impossible to obtain a photomask having a desired light-shielding pattern.

The blank on which a photo- or electron beam-sensitive resin film has been formed in non-uniform thickness is regarded as a blank with a resist of unacceptable film thickness and cannot be used practically. However, when such a blank with a resist of unacceptable film thickness is made of an expensive light-transmitting substrate such as silica glass or the like, the light-transmitting substrate is reutilized by immersing the blank in a peeling solution for photo- or electron beam-sensitive resin to peel off the photo- or electron beam-sensitive resin (the resist) and then peeling off and removing the light-shielding film with a given etching solution. The resulting light-transmitting substrate is repolished and then provided with a new light-shielding film to produce a blank; and a photo- or electron beam-sensitive resin is coated on the light-shielding film.

As the peeling solution used when the photo- or electron beam-sensitive resin to be peeled off hereby is a photoresist sensitive to a light such as ultraviolet light or the like, there has been known the following peeling solutions, that is, a photoresist peeling solution consisting of a mixture of an aqueous hydrogen peroxide and sulfamic acid (Japanese Patent Application Kokai (Laid-Open) No. 13776/1977), a photoresist film remover consisting of a mixture obtained by adding an acid to a persulfate, hydrogen peroxide or hydrogen peroxide adduct (Japanese Patent Application Kokai (Laid-Open) No. 24627/1979), and a photoresist peeling solution consisting of a mixture of acetone and N,N-dimethylformamide (Japanese Patent Publication No. 6101/1982).

The photo- or electron beam-sensitive resin to be peeled off includes, besides the above mentioned photoresists, electron beam resists sensitive to electron beam and the electron beam resists include those of negative type and those of positive type. The electron beam resists of negative type include, for example, an epoxy resin, an unsaturated dicarboxylic acid resin and a polystyrene, and the electron beam of positive type include, for example, a polyolefinsulfone and a polymethyl methacrylate.

As the peeling solution for these electron beam resists, there are known methyl ethyl ketone, hot concentrated sulfuric acid, dimethyl sulfoxide, methylene chloride, etc.

With the above conventional peeling solutions for photoresist or even with the above conventional peeling solutions for electron beam resist, it is difficult to peel off electron beam resists reliably in a short time.

Therefore, a very long time is required when a blank whose light-transmitting substrate is to be reutilized is immersed in a conventional peeling solution for electron beam resist to peel off the electron beam resist and then is treated with a given etching solution to remove the light-shielding film. It is because a very thin resist film remains on the light-shielding film at the time of the peeling of the electron beam resist owing to the strong adhesion of the resist to the light-shielding film and hinders the removal of the light-shielding film.

Meanwhile, a developing solution used in the step of subjecting an electron beam resist of negative type to development can be used also as a peeling solution for that electron beam resist of negative type. However, the above developing solution is expensive and accordingly its use also as a peeling solution is not practical. Further, when the developing solution is used also as a peeling solution as mentioned above, one specific developing solution must be prepared for one specific electron beam resist of negative type, which not only incurs a high cost but also makes the operation complex.

The first object of the present invention is to provide a peeling solution for photo- or electron beam-sensitive resin which can reliably peel off various types of photo- or electron beam-sensitive resins from substrates on which said photo- or electron beam-sensitive resins are coated.

The second object of the present invention is to provide a process for peeling off a photo- or electron beam-sensitive resin, which can reliably peel off various types of photo- or electron beam-sensitive resins from substrates on which said photo- or electron beam-sensitive resins are coated and, when said substrates are photomask blanks, can further facilitate the removal of the light-shielding films of the photomask blanks by an etching treatment to be applied after the peeling of photo- or electron beam-sensitive resin.

Other objects of the present invention will be apparent from the following description.

SUMMARY OF THE INVENTION

The present invention has been made in order to achieve the above objects. The peeling solution for photo- or electron beam-sensitive resin according to the present invention is characterized by consisting of an aqueous solution comprising hydrogen peroxide and a compound represented by the general formula (I)

wherein $R_1$ is H or an alkyl group of 1-2 carbon atoms, $R_2$ is H or an alkyl group of 1-3 carbon atoms, and $R_3$ is H or an alkyl group of 1-3 carbon atoms.

The process for peeling off a photo- or electron beam-sensitive resin according to the present invention is characterized by comprising a step of treating a photo- or electron beam-sensitive resin-coated substrate with a peeling solution for photo- or electron beam-sensitive resin consisting of an aqueous solution comprising hydrogen peroxide and a compound represented by the above general formula (I).

DETAILED DESCRIPTION OF THE INVENTION

The present invention is described in detail below.

In the peeling solution for photo- or electron beam-sensitive resin according to the present invention, examples of the compound represented by the general formula (I) include the followings. But the compound is not restricted thereto.

|  | $R_1$ | $R_2$ | $R_3$ |
|---|---|---|---|
| (A) Formamides |  |  |  |
| Formamide | H | H | H |
| N,N-Dimethylformamide (DMF) | H | $CH_3$ | $CH_3$ |
| N-Methylformamide | H | H | $CH_3$ |
| N-Ethylformamide | H | H | $C_2H_5$ |
| N-Propylformamide | H | H | $C_3H_7$ |
| N-Methyl N-ethylformamide | H | $CH_3$ | $C_2H_5$ |
| N-Methyl N-propylformamide | H | $CH_3$ | $C_3H_7$ |
| N,N-Diethylformamide | H | $C_2H_5$ | $C_2H_5$ |
| N-Ethyl N-propylformamide | H | $C_2H_5$ | $C_3H_7$ |
| N,N-Dipropylformamide | H | $C_3H_7$ | $C_3H_7$ |
| (B) Acetamides |  |  |  |
| N-Methylacetamide | $CH_3$ | H | $CH_3$ |
| N-Ethylacetamide | $CH_3$ | H | $C_2H_5$ |
| N-Propylacetamide | $CH_3$ | H | $C_3H_7$ |
| N,N-Dimethylacetamide (DMAc) | $CH_3$ | $CH_3$ | $CH_3$ |
| N-Methyl N-ethylacetamide | $CH_3$ | $CH_3$ | $C_2H_5$ |
| N-Methyl N-propylacetamide | $CH_3$ | $CH_3$ | $C_3H_7$ |
| N,N-Diethylacetamide | $CH_3$ | $C_2H_5$ | $C_2H_5$ |
| N-Ethyl N-propylacetamide | $CH_3$ | $C_2H_5$ | $C_3H_7$ |
| N,N-Dipropylacetamide | $CH_3$ | $C_3H_7$ | $C_3H_7$ |
| (C) Propionamides |  |  |  |
| N-Methylpropionamide | $C_2H_5$ | H | $CH_3$ |
| N-Ethylpropionamide | $C_2H_5$ | H | $C_2H_5$ |
| N-Propylpropionamide | $C_2H_5$ | H | $C_3H_7$ |
| N,N-Dimethylpropionamide | $C_2H_5$ | $CH_3$ | $CH_3$ |

The compound of the general formula (I) can be used alone or in combination of two or more.

The ratio of hydrogen peroxide and the compound of the general formula (I) can be various but, to increase the peeling efficiency, is preferably 100:1 to 10:1 by volume.

The concentrations of hydrogen peroxide and the compound of the general formula (I) in the peeling solution are preferably 50-700 grams per liter and 1-100 grams per liter, respectively.

The peeling solution can contain other components such as surfactant (e.g. nonylphenol polyoxyethylene ether, dodecylbenzenesulfonic acid, sodium lauryl sulfate), stabilizer (e.g. silicate, stannate, phosphoric acid, pyrophosphate, hydroxyquinoline, acetanilide, barbituric acid, aminotri(methylenephosphonic acid), ethylenediaminetetra(methylenephosphonic acid), 1-hydroxyethylidene 1,1-diphosphonic acid, ethylenediaminetetraacetic acid, nitrilotriacetic acid) and the like to such an extent that the required properties of the peeling solution are not impaired.

The peeling solution of the present invention can be prepared in various methods. The peeling solution can be prepared by mixing an aqueous hydrogen peroxide solution with a compound of the general formula (I) or an aqueous solution thereof, or by mixing hydrogen peroxide or an aqueous solution thereof, a compound of the general formula (I) or an aqueous solution thereof, and water. The peeling solution of the present invention also includes a kit consisting of an aqueous hydrogen peroxide solution contained in a given container and a compound of the general formula (I) or an aqueous solution thereof contained in another given container, both of which are mixed prior to use.

As the photo- or electron beam-sensitive resin which can be peeled off by the peeling solution of the present invention, there can be mentioned electron beam resists of negative type composed of a polystyrene, an epoxy resin, an unsaturated dicarboxylic acid resin, glycidyl methacrylate-ethyl acrylate copolymer or the like, as well as electron beam resists of positive type composed of a polyolefinsulfone, a polymethyl methacrylate, methyl acrylate-acrylonitrile copolymer or the like. Besides these electron beam resists, the photo- or electron beam-sensitive resin may be various photoresists of negative type composed of a polyvinyl cinnamate resin or the like and various photoresists of positive type composed of a novolac type phenolic resin or the like.

As the substrate from which a photo- or electron beam-sensitive resin is peeled off by the peeling solution of the present invention, a photomask blank is most preferable. The reason is that the peeling solution of the present invention not only enables the reliable peeling of photo- or electron beam-sensitive resin but also facilitates the removal of light-shielding film from the photomask blank in an etching treatment after the peeling of the photo- or electron beam-sensitive resin.

As the light-transmitting substrate of the photomask blank, there can be mentioned those composed of silica glass, soda lime glass, aluminoborosilicate glass, aluminosilicate glass, ceramic, sapphire or the like. As the light-shielding film of the photomask blank, there can be mentioned those composed of a metal (e.g. titanium, tantalum, tungsten, molybdenum), its oxide, nitride, carbide, silicide or boride, or the like.

The substrate from which a photo- or electron beam-sensitive resin is peeled off by the peeling solution of the present invention, also includes various other substrates such as a semiconductor substrate composed of a silicon wafer or the like, a glass substrate composed of aluminoborosilicate glass or the like, a ceramic substrate composed of alumina or the like, a substrate consisting of a light-transmitting substrate and a transparent condutive film formed on one main surface of the light-transmitting substrate, and a resin substrate composed of an acrylic resin or the like. The shape of the substrate is optional and can be a plate, a cube, etc.

The substrate from which a photo- or electron beam-sensitive resin is peeled off by the peeling solution of the present invention includes not only those used in electrical and electronic fields but also those used in other technological fields.

In order to obtain a peeling efficiency as high as possible, it is preferable that the peeling solution of the present invention be used at a temperature of 40° C. or above. However, the solution temperature may be below 40° C. if the peeling power of the solution can be increased by the proper selection of the ratio of hydrogen peroxide and the compound of the general formula (I), the type of the compound of the general formula (I), etc. The solution temperature is preferably 80° C. or above when an electron beam resist of negative type composed of a polystyrene is peeled off. When other electron beam resists of negative type, electron beam resists of positive type and photoresists of positive or negative type are peeled off, the solution temperature is preferably 40° C. or above.

It is preferable that the peeling treatment be effected by immersing a photo- or electron beam-sensitive resin-coated substrate in a peeling solution. The immersion time varies depending upon the peelability of photo- or electron beam-sensitive resin or the amount of photo- or electron beam-sensitive resin coated, but is generally 1-60 minutes.

As the peeling treatment method, there can be adopted, besides the above immersion method, for example, a method of dropping a peeling solution on a photo- or electron beam-sensitive resin-coated substrate and then spreading the solution thereon, or a method of spraying a peeling solution on a photo- or electron beam-sensitive resin-coated substrate.

The present invention is described in more detail below by way of Examples.

EXAMPLES 1-7

There was used, as a substrate, a photomask blank consisting of (a) a light-transmitting substrate of 5 in. × 5 in. × 0.09 in. made of polished silica glass and (b) a light-shielding film of chromium (film thickness: 1,050 Å) formed on one main surface of the light-transmitting substrate by sputtering. On the light-shielding film of the photomask blank was coated by spin coating, a chloromethylated polystyrene (CMS) manufactured by TOSOH CO., LTD. as a negative type electron beam resist of polystyrene type. The CMS-coated blank was baked for 25 minutes in an atmosphere of 130° C. to prepare a photomask blank having a negative type electron beam resist film 5,000 Å in thickness (a blank with negative type electron beam resist). In this blank with negative type electron beam resist, however, the film thickness of the resist was non-uniform and it became necessary to peel off the resist.

Hence, a peeling solution for photo- or electron beam-sensitive resin to be used in Example 1 was prepared by mixing a 34% (by weight) aqueous hydrogen peroxide solution and N,N-dimethylformamide (hereinafter referred to as DMF) at a volume ratio of 100/1 and heating the resulting mixture to 80° C. The peeling solution contains 33.7% of hydrogen peroxide and 0.8% of DMF.

Next, peeling solutions for photo- or electron beam-sensitive resin to be used in Examples 2-6 were prepared in the same manner as in Example 1 except that DMF used in Example 1 was replaced by N-ethylformamide, N,N-diethylformamide, N-methylacetamide, N,N-dimethylacetamide (hereinafter referred to as DMAc) and N,N-dimethylpropionamide in Examples 2-6, respectively. Also, a peeling solution for photo- or electron beam-sensitive resin to be used in Example 7 was prepared in the same manner as in Example 1 except that DMF used in Example 1 was replaced by a mixture of DMF and DMAc (volume ratio: 0.5/0.5). The compositions of the above prepared peeling solutions of Examples 1-7 are shown in Table 1.

Then, the above blank with negative type electron beam resist was immersed in each of the peeling solutions of Examples 1-7 (solution temperature: 80° C.) for a given length of time (10 minutes in Examples 1-5 and 7 and 20 minutes in Example 6) to peel off the negative type electron beam resist from the surface of the light-shielding film. Thereafter, each blank was rinsed with tap water and dried. Upon visual observation of the surface of the light-shielding film of each photomask blank, the resist had been satisfactorily peeled off and removed in each blank.

Each of the above photomask blanks from which the negative type electron beam resist had been peeled off was then immersed in an specific etching solution for chromium light-shielding film (solution temperature: 20° C.) obtained by dissolving 200 g of ceric nitrate ammonium and 50 ml of perchloric acid in one liter of pure water, and a time required for the removal of the chromium light-shielding film was measured. The time was 60 seconds in all cases, as shown in Table 1. Incidentally, the removal by the same etching solution, of the chromium light-shielding film from the above prepared photomask blank without the formation of the negative type electron beam resist film thereon required the same 60 seconds. Therefore, it was confirmed that no thin film of negative type electron beam resist remained on the surface of the light-shielding film of each photomask blank from which the negative type electron beam resist had been peeled off, and consequently the removal of the light-shielding film was not hindered.

COMPARATIVE EXAMPLES 1-4

As a comparative peeling solution for photo- or electron beam-sensitive resin, there were used methyl ethyl ketone (hereinafter referred to as MEK) in Comparative Example 1, hot concentrated sulfuric acid in Comparative Example 2, dimethyl sulfoxide in Comparative Example 3 and a mixed solution of acetone and DMF in Comparative Example 4. The same blank with negative type electron beam resist as used in Examples 1-7 was immersed in each of the above peeling solutions at given temperatures for given lengths of time shown in Table 1 in order to peel off the resist. As a result, it was clear by visual observation that the resist was apparently peeled off and removed in Comparative Examples 1, 2 and 4 which used, as the peeling solution, MEK, hot concentrated sulfuric acid and a mixed solution of acetone and DMF, respectively, but in Comparative Example 3 which used dimethyl sulfoxide as the peeling solution, the resist could not be peeled and removed even after 10 hours of immersion in peeling solution at 100° C.

Next, the rinsing and drying treatments were effected in the same manner as in Examples 1-7. Then, each of the resulting photomask blanks were treated with the same etching solution as used in Examples 1-7, and the time required for the removal of the chromium light-shielding film of each photomask blank was measured. The results are shown in Table 1. In Comparative Example 2 which used hot concentrated sulfuric acid as the peeling solution, more than 5 hours was required for the removal of chromium light-shielding film; in Comparative Examples 1 and 4 which used MEK and a mixed solution of acetone and DMF, respectively, the chromium light-shielding film could not be removed. The reason for the above (taking a long time to remove the chromium light-shielding film or being impossible to remove it) is that the resist appeared to eyes to have been peeled off but actually the resist remained on the surface of the chromium light-shielding film as a thin film of negative type electron beam resist and hindered the removal of the light-shielding film.

That is, the blank with positive type electron beam resist was immersed in each of 7 peeling solutions of Examples 8-14 (maintained at 80° C.) for a given length of time (3 minutes in Examples 8-12 and 14 and 6 minutes in Example 13) to peel off the positive type electron beam resist from the surface of the light-shielding film. Thereafter, each blank was rinsed with tap water and dried. Upon visual observation of the surface of the light-shielding film of each photomask blank, the resist had been satisfactorily peeled off and removed in each blank.

Each of the above photomask blanks from which the positive type electron beam resist had been peeled off was then immersed in the same etching solution as used in Examples 1-7, and a time required for the removal of

TABLE 1

| | Composition of peeling solution[1] | Immersion in peeling solution | | Time required for removal of chromium light-shielding film |
|---|---|---|---|---|
| | | Temp. | Time | |
| Example | | | | |
| 1 | 34 wt. % $H_2O_2$/DMF = 100/1 | 80° C. | 10 min | 60 sec |
| 2 | 34 wt. % $H_2O_2$/N-ethylformamide = 100/1 | 80° C. | 10 min | 60 sec |
| 3 | 34 wt. % $H_2O_2$/N,N-diethylformamide = 100/1 | 80° C. | 10 min | 60 sec |
| 4 | 34 wt. % $H_2O_2$/N-methylacetamide = 100/1 | 80° C. | 10 min | 60 sec |
| 5 | 34 wt. % $H_2O_2$/DMAc = 100/1 | 80° C. | 10 min | 60 sec |
| 6 | 34 wt. % $H_2O_2$/N,N-dimethylpropionamide = 100/1 | 80° C. | 20 min | 60 sec |
| 7 | 34 wt. % $H_2O_2$/DMF/DMAc = 100/0.5/0.5 | 80° C. | 10 min | 60 sec |
| Comparative Example | | | | |
| 1 | MEK | 20° C. | 12 hr | Film unremovable. |
| 2 | Hot concentrated sulfuric acid | 90° C. | 5 min | More than 5 hr. |
| 3 | Dimethyl sulfoxide | 100° C. | 10 hr | Not measured because resist did not peel. |
| 4 | Mixed solution of acetone and DMF | 25° C. | 3 min | Film unremovable. |

[1]Ratio of components in peeling solution is volume ratio.

EXAMPLES 8-14

The same blank as in Examples 1-7 was used as a substrate. On the light-shielding film of the blank was coated, by spin coating, a polybutene-1-sulfone (PBS) as a positive type electron beam resist of polyolefinsulfone type. The PBS-coated blank was baked for 60 minutes the chromium light-shielding film was measured. The time was 60 seconds in all cases, as shown in Table 2. For the same reasons as described in Examples 1-7, it was confirmed that no thin film of positive type electron beam resist remained on the surface of the light-shielding film of each photomask blank from which the positive type electron beam resist had been peeled off.

TABLE 2

| | Composition of peeling solution[1] | Immersion in peeling solution | | Time required for removal of chromium light-shielding film |
|---|---|---|---|---|
| | | Temp. | Time | |
| Example | | | | |
| 8 | 34 wt. % $H_2O_2$/DMF = 100/1 | 80° C. | 3 min | 60 sec |
| 9 | 34 wt. % $H_2O_2$/N-ethylformamide = 100/1 | 80° C. | 3 min | 60 sec |
| 10 | 34 wt. % $H_2O_2$/N,N-diethylformamide = 100/1 | 80° C. | 3 min | 60 sec |
| 11 | 34 wt. % $H_2O_2$/N-methylacetamide = 100/1 | 80° C. | 3 min | 60 sec |
| 12 | 34 wt. % $H_2O_2$/DMAc = 100/1 | 80° C. | 3 min | 60 sec |
| 13 | 34 wt. % $H_2O_2$/N,N-dimethylpropionamide = 100/1 | 80° C. | 6 min | 60 sec |
| 14 | 34 wt. % $H_2O_2$/DMF/DMAc = 100/0.5/0.5 | 80° C. | 3 min | 60 sec |

[1]Ratio of components in peeling solution is volume ratio.

in an atmosphere of 120° C. to prepare a photomask blank having a positive type electron beam resist film of 4,000 Å in thickness (a blank with positive type electron beam resist).

In this blank with positive type electron beam resist, however, the film thickness of the resist was non-uniform and it became necessary to peel off the resist.

Hence, in Examples 8-14, the peeling of the resist from the blank with positive type electron beam resist was effected as follows using the same peeling solutions as in Examples 1-7 (the same peeling solutions as used in Examples 1-7 were used in Examples 8-14, respectively).

EXAMPLE 15

In this Example, the peeling solution for photo- or electron beam-sensitive resin of the present invention was examined for the change of peeling power with time.

First, 6 blanks with positive type electron beam resist (5 in. × 5 in. × 0.09 in.), all of which were the same as used in Examples 8-14, were each cut along the center line parallel to the opposing two fringe lines, into two pieces with a glass cutter to prepare 12 test samples (5 in. × 2.5 in. × 0.09 in.). As mentioned below, 11 of these test samples were used in this Example.

Then, a 35 wt. % aqueous hydrogen peroxide solution (0.5 liter) and DMAc were mixed at a volume ratio of 100/1 and heated to 80° C. to prepare a peeling solution having the same composition as used in Example 12. The peeling solution was measured for initial concentration of hydrogen peroxide according to the potassium permanganate titration method specified by JIS (Japanese Industrial Standard) K 8230. The initial hydrogen peroxide concentration was 35.0% by weight as shown in Table 3.

After the peeling solution had been kept at 80° C. for 1 hour, one of the test samples was added to the solution and immersed therein for 10 minutes. After 10 minutes of the immersion, the positive type electron beam resist of the test sample was satisfactorily peeled off from the surface of the light-shielding film and no thin resist film remained thereon. The hydrogen peroxide concentration after 10 minutes of the immersion was 35.2% as shown in Table 3, which was almost same as the initial concentration.

Next, there was measured hydrogen peroxide concentrations after the peeling solution had been kept at 80° C. for 2 and 3 hours. They were 35.1% and 35.0%, respectively, as shown in Table 3 and were almost same as the initial concentration.

From 3.5 hours to 8 hours after the preparation of the peeling solution, each one test sample was added to the peeling solution at intervals of 0.5 hour and immersed therein for 10 minutes. After 10 minutes of each immersion, the positive type electron beam resist of each test sample was satisfactorily peeled off from the surface of the light-shielding film and no thin resist film remained thereon. The hydrogen peroxide concentrations after 10 minutes of the imersion showed only very slight reduction from 3.5 hours to 8 hours as shown in Table 3. Thus, the peeling solution of the present invention was found to have good peeling power after 8 hours.

electron beam resist composed of chloromethylated polystyrene is peeled off from the photomask blank as if the bark is peeled off from a tree. Therefore, when the positive type electron beam resist composed of polybutene-1-sulfone is treated with the peeling solution of the present invention, the hydrogen peroxide concentration in peeling solution is more affected because the resist dissolves in the peeling solution to cause a reaction therewith. In view of this matter, it can be said that the peeling solution of Example 15 retains better peeling power for the negative type electron beam resist composed of chloromethylated polystyrene than for the positive type electron beam resist composed of polybutene-1-sulfone, even after an elapse of a long time.

In Example 15, the immersion time was set at 10 minutes which was longer than 3 minutes in Example 12 using the same peeling solution. This longer immersion time was selected in order to examine whether or not the peeling solution still retained sufficient peeling power even if the peeling solution had reacted with the chromium light-shielding film exposed as the result of peeling of the resist and thereby the hydrogen peroxide concentration in peeling solution had been reduced.

As described above, the peeling solution for photo- or electron beam-sensitive resin according to the present invention can peel off photo- or electron beam-sensitive resins reliably in a short time and can retain good peeling power for a long time.

The process for peeling off a photo- or electron beam-sensitive resin according to the present invention can peel off photo- or electron beam-sensitive resins coated on substrates reliably in a short time.

Further, when said substrates are photomask blanks, the process for peeling off a photo- or electron beam-sensitive resin according to the present invention can peel off photo- or electron beam-sensitive resins coated on the blanks reliably in a short time and can facilitate

TABLE 3

| | Time from the production of peeling solution, (hr) | | | | | | | | | | | | | |
|---|---|---|---|---|---|---|---|---|---|---|---|---|---|---|
| | 0 | 1.0 | 2.0 | 3.0 | 3.5 | 4.0 | 4.5 | 5.0 | 5.5 | 6.0 | 6.5 | 7.0 | 7.5 | 8.0 |
| Immersion of test sample | No | Yes | No | No | Yes | Yes | Yes | Yes | Yes | Yes | Yes | Yes | Yes | Yes |
| Peeling of resist | — | Good | — | — | Good | Good | Good | Good | Good | Good | Good | Good | Good | Good |
| $H_2O_2$ concentration[*1], (wt. %) | 35.0 | 35.2 | 35.1 | 35.0 | 34.8 | 34.9 | 34.9 | 34.7 | 34.6 | 33.7 | 33.5 | 33.4 | 33.1 | 32.9 |

[*1]The $H_2O_2$ concentration when a test sample was immersed is a $H_2O_2$ concentration after 10 minutes of the immersion.

The change of peeling power with time was examined also on peeling solutions having the same compositions as in Examples 8 and 14, in the same manner as in Example 15. The results were similar to that of Example 15. As is clear from the above, the peeling solution for photo- or electron beam-sensitive resin according to the present invention retains good peeling power even after an elapse of a long time from the preparation or even after the use for a long time, and can reliably peel off photo- or electron beam-sensitive resins.

In Example 15, the change of peeling power with time was examined using a blank coated with a positive type electron beam resist composed of polybutene-1-sulfone as photo- or electron beam-sensitive resin. This positive type electron beam resist composed of polubutene-1-sulfone, as compared with a negative type electron beam resist composed of chloromethylated polystyrene, easily dissolves in a peeling solution and, by the help of the dissolution, is peeled off and removed from the photomask blank. Meanwhile, the negative type the removal of the light-shielding film of the blank by the subsequent etching treatment.

What is claimed is:

1. A peeling solution for photo- or electron beam-sensitive resin consisting of an aqueous solution consisting of hydrogen peroxide and a compound represented by the general formula (I)

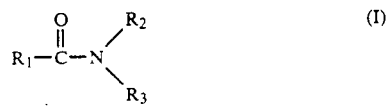

wherein $R_1$ is H or an alkyl group of 1–2 carbon atoms, $R_2$ is H or an alkyl group of 1–3 carbon atoms, and $R_3$ is H or an alkyl group of 1–3 carbon atoms.

2. A peeling solution for photo- or electron beam-sensitive resin according to claim 1, wherein the compound of the general formula (I) is at least one member selected from the group consisting of formamides, acetamides, and propionamides.

3. A peeling solution for photo- or electron beam-sensitive resin according to claim 2, wherein the formamides are at least one member selected from the group consisting of formamide, N,N-dimethylformamide, N-methylformamide, N-ethylformamide, N-propylformamide, N-methyl N-ethylformamide, N-methyl N-propylformamide, N,N-diethylformamide, N-ethyl N-propylformamide and N,N-dipropylformamide.

4. A peeling solution for photo- or electron beam-sensitive resin according to claim 2, wherein the acetamides are at least one member selected from the group consisting of N-methylacetamide, N-ethylacetamide, N-propylacetamide, N,N-dimethylacetamide, N-methyl N-ethylacetamide, N-methyl N-propylacetamide, N,N-diethylacetamide, N-ethyl N-propylacetamide and N,N-dipropylacetamide.

5. A peeling solution for photo- or electron beam-sensitive resin according to claim 2, wherein the propionamides are at least one member selected from the group consisting of N-methylpropionamide, N-ethylpropionamide, N-propylpropionamide and N,N-dimethylpropionamide.

6. A peeling solution for photo- or electron beam-sensitive resin according to claim 1, wherein the photo- or electron beam-sensitive resin to be peeled off is an electron beam resist of negative or positive type.

* * * * *